(12) United States Patent
Zhou et al.

(10) Patent No.: US 9,690,212 B2
(45) Date of Patent: Jun. 27, 2017

(54) HYBRID FOCUS-EXPOSURE MATRIX

(71) Applicant: Taiwan Semiconductor Manufacturing Company, Ltd., Hsin-Chu (TW)

(72) Inventors: Wen-Zhan Zhou, Zhubei (TW); Heng-Jen Lee, Baoshan Township (TW); Yen-Liang Chen, Zhubei (TW); Kai-Hsiung Chen, New Taipei (TW); Chih-Ming Ke, Hsinchu (TW); Ho-Yung David Hwang, Hsinchu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 887 days.

(21) Appl. No.: 13/902,622

(22) Filed: May 24, 2013

(65) Prior Publication Data
US 2014/0257761 A1 Sep. 11, 2014

Related U.S. Application Data

(60) Provisional application No. 61/775,835, filed on Mar. 11, 2013.

(51) Int. Cl.
*G06F 17/50* (2006.01)
*G03F 7/20* (2006.01)
(52) U.S. Cl.
CPC ...... *G03F 7/70641* (2013.01); *G03F 7/70558* (2013.01)

(58) Field of Classification Search
CPC .................. G03F 7/70641; G03F 7/70558
USPC .................................. 703/1, 2, 3, 4
See application file for complete search history.

(56) References Cited

U.S. PATENT DOCUMENTS 5,381,233 A * 1/1995 Chao ............... G01N 21/21 356/364
6,714,892 B2 * 3/2004 Houge ............. G03F 7/70491 702/155
7,065,423 B2 * 6/2006 Prager .............. G01B 11/24 438/16

(Continued)

OTHER PUBLICATIONS

Vaid_2011 (A Holistic Metrology Approach: Hybrid Metrology Utilizing Scatterometry, CD-AFM and CD-SEM, Metrology, Inspection, and Process Control for Microlithography, XXV, edited by Christopher J. Raymond, Proc. of SPIE vol. 7971, 797103, 2011 SPIC).*

(Continued)

*Primary Examiner* — Kamini S Shah
*Assistant Examiner* — Brian S Cook
(74) *Attorney, Agent, or Firm* — Haynes and Boone, LLP

(57) ABSTRACT

A method for controlling semiconductor production through use of a hybrid Focus Exposure Matrix (FEM) model includes taking measurements of a set of structures formed onto a substrate. The method further includes using a FEM model to determine focus and exposure conditions used to form the structure The model was created through use of measurements of structures formed on a substrate under varying focus and exposure conditions, the measurements being taken using both an optical measurement tool and a scanning electron microscope.

19 Claims, 7 Drawing Sheets

(56) References Cited

U.S. PATENT DOCUMENTS

| | | | | |
|---|---|---|---|---|
| 7,345,761 B1* | 3/2008 | Aoyagi | ............. | G01B 11/0625 |
| | | | | 356/369 |
| 7,362,686 B1* | 4/2008 | Aoyagi | ................. | G01B 11/06 |
| | | | | 356/601 |
| 7,382,447 B2* | 6/2008 | Mieher | ............... | G03F 7/70625 |
| | | | | 356/124 |
| 7,553,678 B2 | 6/2009 | Zhou et al. | | |
| 7,602,509 B1* | 10/2009 | Hench | ................. | G01N 21/4788 |
| | | | | 356/445 |
| 7,760,358 B1* | 7/2010 | Aoyagi | ............. | G01N 21/8422 |
| | | | | 356/369 |
| 8,798,966 B1* | 8/2014 | Hench | ................... | G06F 13/105 |
| | | | | 703/1 |

OTHER PUBLICATIONS

Kritsun_2007 (O. Kritsun et al., "Evaluating the Performance of a 193nm Hyper-NA Immersion Scanner Using Scatterometry" Proc. SPIE 6520, 1-10 (2007)).*

Nishi_2000 (Handbook of Semiconductor Manufacturing Technology, Marcel Dekker, Inc. 2000).*

Tzai_2012 (Apply Multiple Target for Advanced Gate ACI Critical Dimension Measurement by Scatterometry Technology, Metrology, Inspection, and Process Control for Microlithography XXVI, Proc. SPIE vol. 8324, 832420 (Mar. 29, 2012).).*

\* cited by examiner

HYBRID FOCUS-EXPOSURE MATRIX

PRIORITY DATA

This patent is a non-provisional of U.S. Ser. No. 61/775,835 filed Mar. 11, 2013, the entire disclosure of which is hereby incorporated by reference.

BACKGROUND

As semiconductor fabrication technology advances, the size structures formed into semiconductor devices decreases. This makes it more important to control the critical dimensions of the structures formed into a semiconductor substrate. Small changes in the critical dimension can cause unacceptable changes to the semiconductor components. Thus, measurement and control techniques are very important to efficient semiconductor fabrication.

Methods for measuring structures formed into a semiconductor substrate include optical tools that utilize scatterometry. Scatterometry refers to the process of measuring light spectra to determine the size of periodic structures. Scatterometry can provide information such as pitch, sidewall angles, and line width. Another tool that can be used to measure characteristics of structures formed into semiconductor substrates is a scanning electron microscope.

Various conditions may affect the characteristics of structures on a substrate. For example, the intensity of light used to expose a photoresist layer affects the characteristics of the structure. The level of intensity of light may be referred to as dosage or exposure. Another condition that affects the characteristics of structures is the focus of the photolithography tool. The photolithography tool can be set to focus at varying depths into a photoresist layer.

The combination of both focus and exposure has a significant effect on the overall characteristics of structures formed into a substrate. Moreover, the focus and exposure settings of a photolithography tool may drift over time. Thus, it is useful to monitor this drift and make adjustments as necessary to ensure the formation of structures with desired characteristics. One effective means of monitoring and controlling the semiconductor fabrication process is to model the relationships between measured characteristics and focus and exposure settings. It is therefore desirable to find effective methods of modeling these relationships.

BRIEF DESCRIPTION OF THE DRAWINGS

Aspects of the present disclosure are best understood from the following detailed description when read with the accompanying figures. It is emphasized that, in accordance with the standard practice in the industry, various structures are not drawn to scale. In fact, the dimensions of the various structures may be arbitrarily increased or reduced for clarity of discussion.

DETAILED DESCRIPTION

It is to be understood that the following disclosure provides many different embodiments, or examples, for implementing different structures of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various structures may be arbitrarily drawn in different scales for the sake of simplicity and clarity. Furthermore, the formation of a first structure over or on a second structure in the description that follows may include embodiments in which the first and second structures are formed in direct contact, and may also include embodiments in which additional structures may be formed between the first and second structures, such that the first and second structures may not be in direct contact.

Further, spatially relative terms, such as "beneath," "below," "lower," "above," "upper" and the like, may be used herein for ease of description to describe one element or structure's relationship to another element(s) or structure(s) as illustrated in the figures. The spatially relative terms are intended to encompass different orientations of the device in use or operation in addition to the orientation depicted in the figures. For example, if the device in the figures is turned over, elements described as being "below" or "beneath" other elements or structures would then be oriented "above" the other elements or structures. Thus, the exemplary term "below" can encompass both an orientation of above and below. The apparatus may be otherwise oriented (rotated 90 degrees or at other orientations) and the spatially relative descriptors used herein may likewise be interpreted accordingly.

Figure 1:
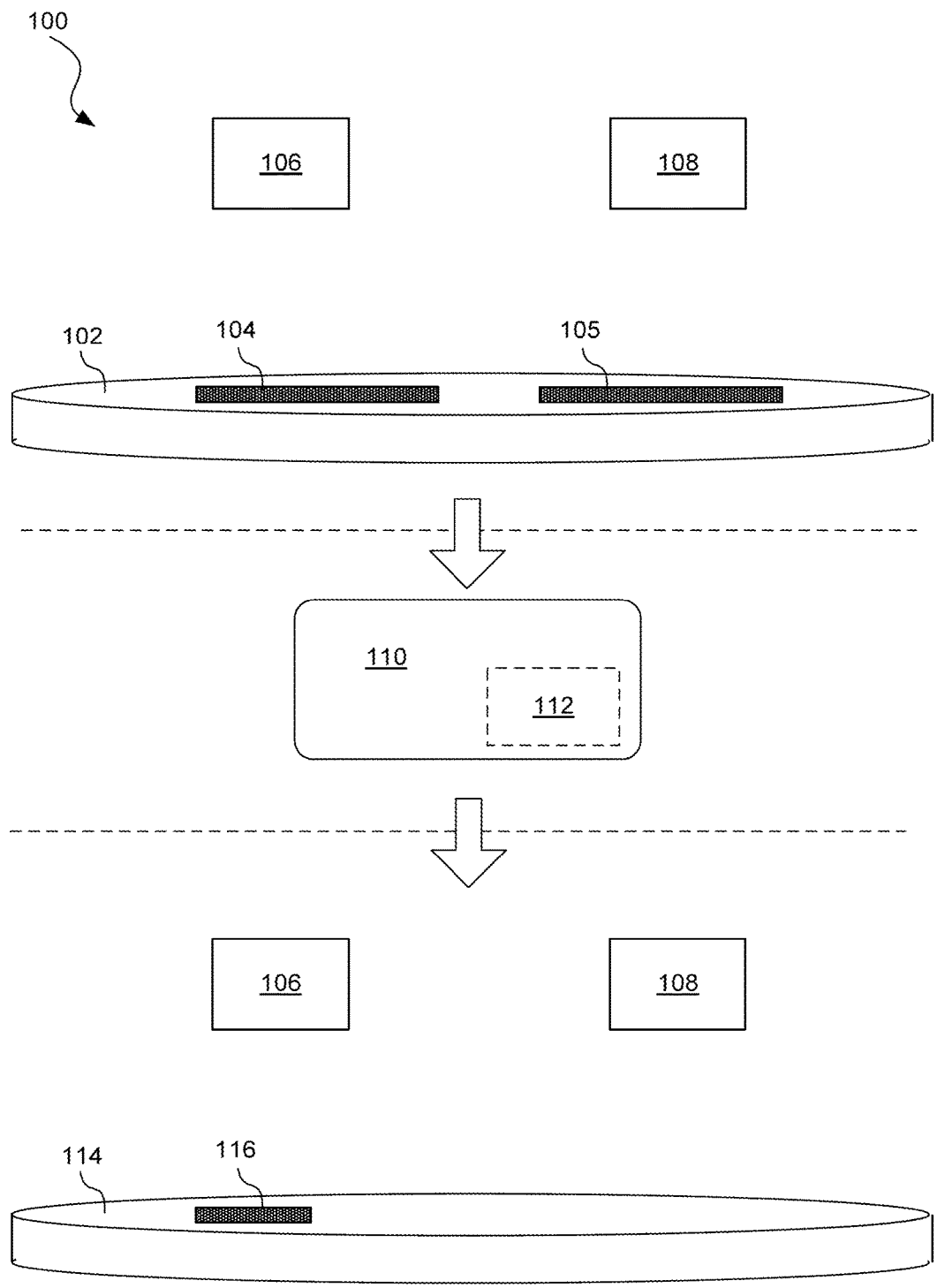
FIG. 1 is a diagram showing an illustrative overview of a process for controlling semiconductor fabrication using a hybrid focus-exposure matrix model, according to one example of principles described herein.

FIG. 1 is a diagram showing an illustrative overview of a process 100 for controlling semiconductor fabrication using a hybrid focus-exposure matrix model. FIG. 1 is meant only to give a brief overview of principles described herein. More detail will be provided below with the text accompanying the remaining figures.

According to certain illustrative examples, a number of structures 104, 105 are formed onto a semiconductor substrate 102. The substrate 102 may include a standard semiconductor substrate. The structures may include a first set of structures 104 that are designed for measurement by an optical measurement tool 106 such as a scatterometer. The structures may also include a second set of structures 105 that are designed to be measured by an electron microscope 108 such as a Critical Dimension-Scanning Electron Microscope (CD-SEM).

The structures 104, 105 are formed under varying conditions. Specifically, the structures 104, 105 are formed with varying exposure levels and dosage levels. In some cases, a photolithography tool that is capable of varying exposure and focus settings at different regions on a substrate may be used. The different exposure and focus levels may be set so that a sufficient dataset of measurements can be achieved. For example, one region of the structures 104 may be formed at a specific exposure level with sub-regions being formed at varying focus levels.

After being formed, the structures 104, 105 are measured by the tools for which they were designed to be measured. Specifically, an optical measurement tool 106 is used to measure the first set of structures 104. Additionally, an electron microscope 108 is used to measure the second set of structures.

The measurements taken are associated with the focus and exposure conditions with which each sub-region of the structures was formed. A computing system 110 may be used to aggregate the data and create a Focus-Exposure Matrix (FEM) for each set of structures. The FEM matrices from both sets of structures 104, 105 can be used to form a hybrid FEM model 112.

With the model available, a third set of structures 116 may be formed into a subsequent substrate 114. This substrate 114 may be a standard production substrate during normal production operations. Thus, for the purpose of simplifying discussion, these structures 116 will be referred to as operating structures 116. The operating structures 116 may include similar structures to first set of structures 104 and the second set of structures 105. The operating structures 116 can then be measured by both the optical measurement tool 106 and the electron microscope 108. These measurements can then be compared with the model 112 to determine an approximate focus and exposure condition that was used to create the structures 116. If the focus or exposure settings have drifted, then adjustments can be made accordingly. Specifically, the optimal settings to achieve the desired structure characteristics can be determined for the production of subsequent semiconductor substrates. Thus, the combination of data taken from the optical measurement tool 106 and the electron microscope 108 allows for a more accurate model.

In some cases, the entity forming the model may be a different entity than the one using the model. For example, one entity may develop a comprehensive model and sell or license that model to other entities for use in semiconductor fabrication. Alternatively, the entity that creates the model may be the same entity using the model for certain semiconductor fabrication purposes.

Figure 2:
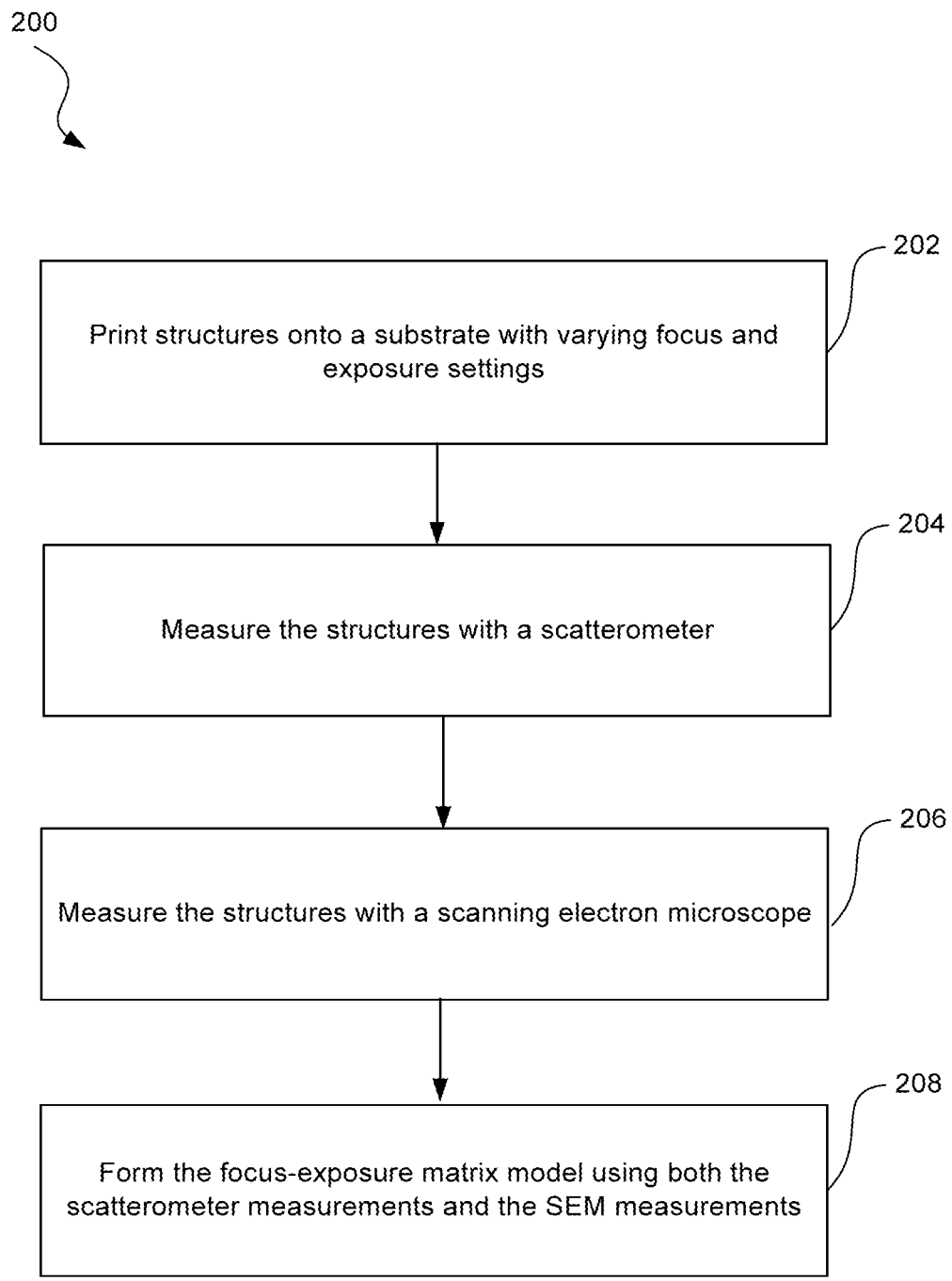
FIG. 2 is a flowchart showing an illustrative method for forming a hybrid focus-exposure matrix model, according to one example of principles described herein.

FIG. 2 is a flowchart showing an illustrative method 200 for forming a hybrid focus-exposure matrix model. According to certain illustrative examples, structures are printed 202 onto a semiconductor substrate. As mentioned above, these structures may include two sets of structures. One set may be for measurement by a scatterometer and one set may be for measurement by a CD-SEM.

For example, the structures for the scatterometer may be a variety of lines with varying critical dimensions or line widths. These structures may also be formed with varying pitches. These structures are periodic so that they can be measured by the scatterometer. The scatterometer works by measuring the wavelength of incident light. The periodic structures act as a grating that will affect the wavelength of incident light. Thus, as the space between the periodic structures varies, so will the wavelength of incident light.

The scatterometer can measure a variety of structure characteristics. For example, the scatterometer can measure the side wall angles of the structures. As structures are formed into semiconductor substrate, the sidewalls are angled due to the etching processes that are used. The angle of the side walls can be determined by measuring the critical dimension at the top of the structures and comparing it with the critical dimension measured at the bottom of the structures. Other photoresist profile characteristics such as pitch and line width can be determined by the scatterometer.

A separate set of structures can be used for measurement by the CD-SEM. For example, structures of varying density may be formed for the CD-SEM. Specifically, isolated structures are better measured with a CD-SEM while dense structures are better measured with a scatterometer. Such variations in density respond differently to varying focus and exposure levels. Thus, measurement of such varying structures is useful for modeling purposes.

After the substrate with all of the structures has been formed, the regions designed for the scatterometer can be measured 204. As mentioned above, the structures may be divided into regions and sub-regions, each with varying conditions. Thus, the measured structures can be accordingly associated with their respective focus settings, exposure settings, and characteristics (i.e., line width or sidewall angles).

Additionally, the structures designed for the scanning electron microscope may be measured 206 with the scanning electron microscope. Likewise, these structures may be divided into regions and sub-regions, each with varying conditions. Thus, the measured structures can be accordingly associated with their respective focus settings, exposure settings, and characteristics (i.e., structure density).

The method continues by forming 208 a focus-exposure matrix model using both the scatterometer measurements and the scanning electron microscope measurements. This model may consist of a number of data points that form a curve. As will be explained further below, the model may be graphically represented by a number of contour lines on a two dimensional graph, with axes representing focus and exposure.

Figure 3:
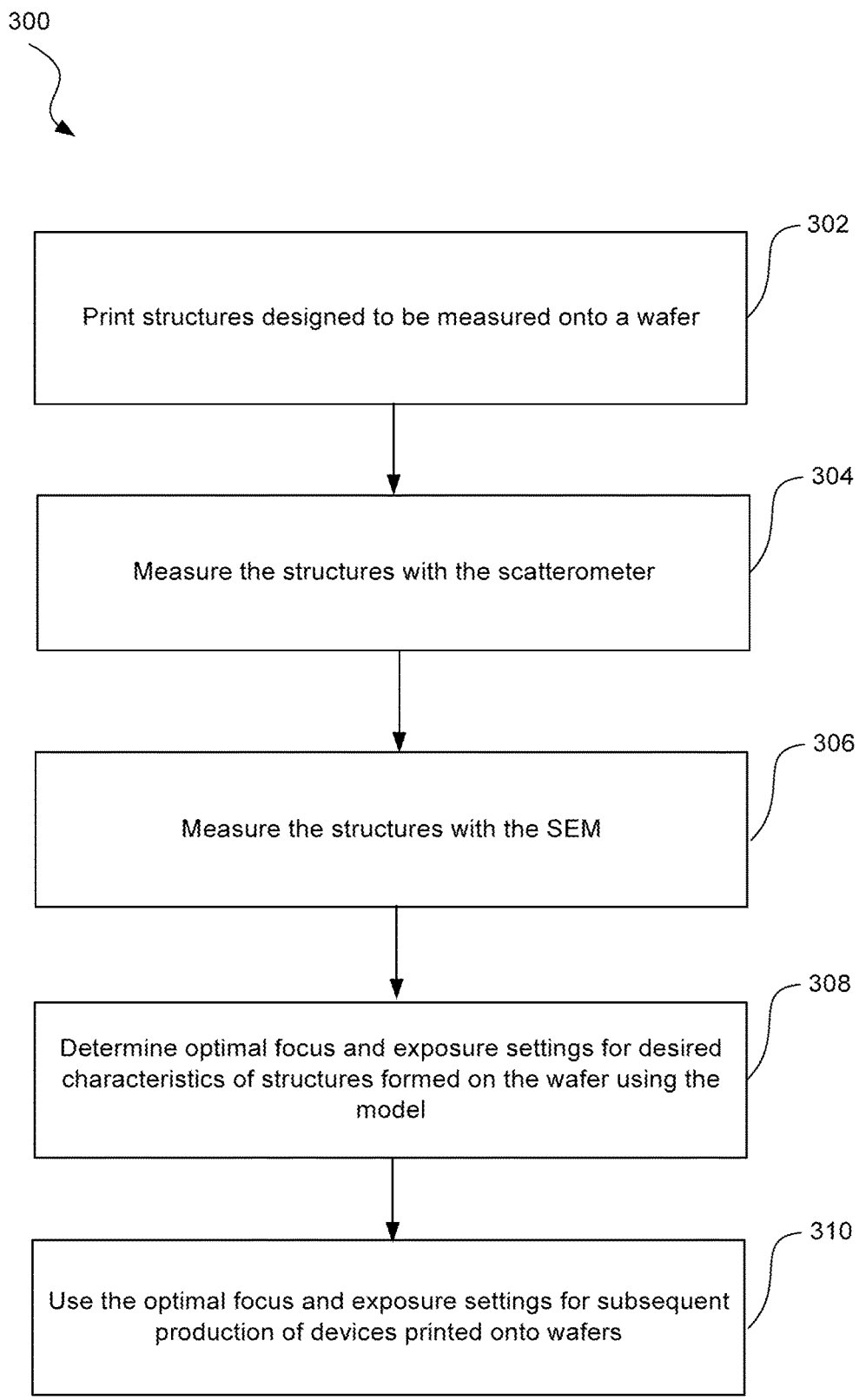
FIG. 3 is a flowchart showing an illustrative method for using the hybrid focus-exposure model to control production, according to one example of principles described herein.

FIG. 3 is a flowchart showing an illustrative method 300 for using the hybrid focus-exposure model to control production. According to certain illustrative examples, set of operating structures is printed onto a substrate. These operating structures may have similar characteristics to the ones printed and measured to form the model. The space used to print such structures may be far less than the space used to print the structures used to create the model. This is because multiple copies of the structures do not need to be printed for various exposure and focus settings. Thus, it may be the case that the operating structures are printed onto a standard production substrate. This allows most of the standard production substrate to be used for circuitry for electronic devices.

The appropriate operating structures can then be measured 304 with a scatterometer. Additionally, the appropriate operating structures can be measured 306 by a scanning electron microscope. These measured characteristics can then be compared to the model in order to calculate the focus and exposure settings that were used to create the structures. For example, if the model indicates that a certain focus and exposure setting combination created structures having a specific line width, then a measurement of the structures on the second substrate having that specific line width indicates that combination of focus and exposure setting. As will be explained further below, the combination of scanning electron microscope data and optical measurement data allows the calculation to be more accurate.

By comparing the measured characteristics of the structures with the model, the manner in which the focus and exposure settings of the photolithography tool can be adjusted to achieve optimal characteristics can be determined 308. For example, if the focus or exposure settings have drifted, the photolithography tool can be adjusted accordingly to compensate for this drift. The precise adjustment is aided by use of the model.

With the optimal focus and exposure settings obtained, the photolithographic tool can be set 310 accordingly for production of subsequent production of semiconductor substrates. At various intervals, the structures may be reprinted on subsequent substrates in order to determine if another adjustment may be useful. Thus, the production process can be effectively controlled.

Figure 4A:
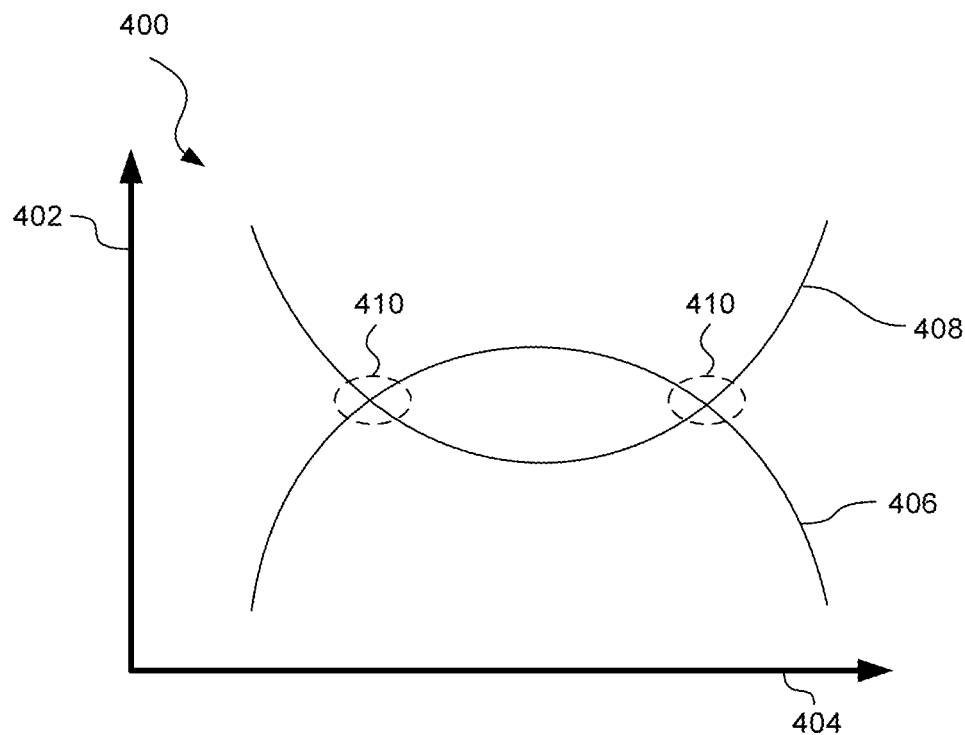
FIG. 4A is a diagram showing an illustrative relationship between focus and exposure for measurements taken with a scanning electron microscope, according to one example of principles described herein.

FIG. 4A is a diagram showing an illustrative relationship between focus and exposure for measurements taken with a scanning electron microscope. According to the present example, the vertical axis 402 represents exposure levels and the horizontal axis 404 represents focus. Thus, a critical dimension is presented as a contour line along the graph 400.

For example, one contour line 406 represents a structure with a specific critical dimension. The other line 408 represents a structure with a different specific critical dimension. The lines 406, 408 represent a continuous combination of focus and exposure settings that will achieve that critical dimension. This continuous line was extrapolated from discrete data points obtained from the measurements of the structures on the substrate. Thus, the lines 406, 408 are not an exact indication of focus and exposure settings that will create the associated critical dimension. Rather, the lines 406, 408 are an estimate derived from the FEM matrix model.

Because there are two points 410 at which the contour line intersects, it can be estimated that the focus and exposure settings used to create the measured structures were near one of those two points. Using this part of the model alone, it cannot be determined which point 410 represents the actual focus and exposure settings. As will be explained further below, use of the data from the optical measurement tool helps to narrow down the appropriate focus and exposure settings.

Figure 4B:
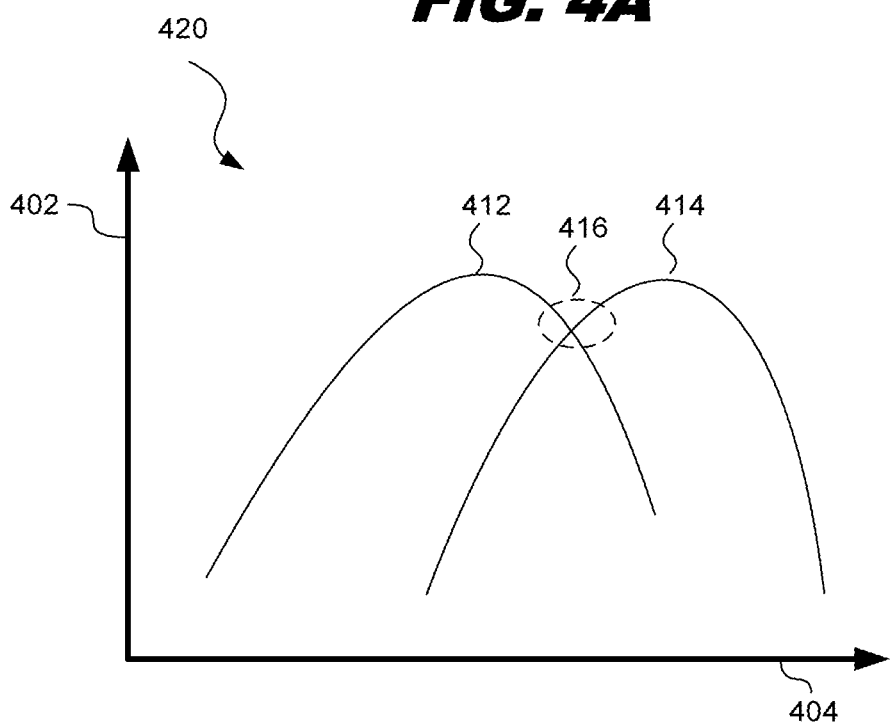
FIG. 4B is a diagram showing an illustrative relationship between focus and exposure for measurements taken with an optical measurement tool, according to one example of principles described herein.

FIG. 4B is a diagram showing an illustrative relationship between focus and exposure for measurements taken with an optical measurement tool. Again, the vertical axis 402 represents exposure levels and the horizontal axis 404 represents focus. Thus, a critical dimension is presented as a contour line along the graph 420.

As mentioned above, the optical measurement tool can measure the top critical dimension of a set of structures as well as the bottom critical dimension of the structures. One contour line 412 represents the bottom critical dimension and the other contour line 414 represents the top critical dimension. By measuring both the top critical dimension and the bottom critical dimension of the operating structures, and comparing those measurements with the model, the focus and exposure settings used to create the operating structures can be found. Specifically, the point 416 at which the two lines 412, 414 cross indicates the approximate settings that were used by the tool that created the operating structures. Because the lines are only a calculated representation, they are not necessarily entirely precise. However, in combination with the data from the CD-SEM measurements, a more accurate setting can be determined.

Figure 5:
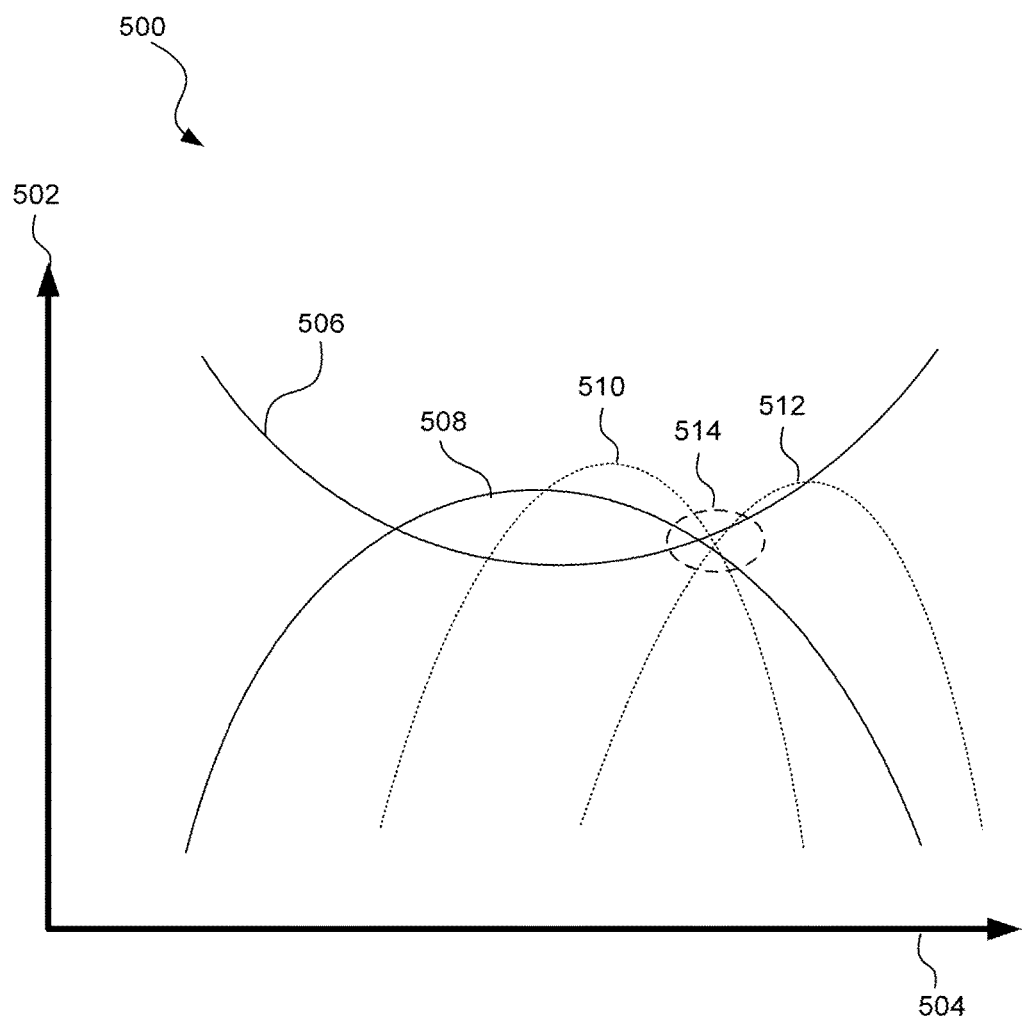
FIG. 5 is a diagram showing an illustrative relationship between focus and exposure for measurements taken with both a scanning electron microscope and an optical measurement tool, according to one example of principles described herein.

FIG. 5 is a diagram showing an illustrative relationship between focus and exposure for measurements taken with both a scanning electron microscope and an optical measurement tool. Again, the vertical axis 502 represents exposure levels and the horizontal axis 504 represents focus. Thus, the various measured critical dimensions are presented as contour lines along the graph 500.

The lines representing the possible focus and exposure settings used to form the structures as measured by an electron microscope are illustrated as solid lines 506, 508. The lines representing the possible focus and exposure settings used to form the optically measured characteristics of the structures are illustrated as dotted lines 510, 512. As is illustrated, there is a point 514 at which all lines intersect. In some cases, the lines will not necessarily all intersect at the exact point due to the approximation efficiency of the model. However, all lines will intersect near a specific point.

The point 514 indicates the exposure and focus settings used to create the measured structures. The model can also be used to indicate how adjustments in the exposure or focus settings will affect the critical dimensions of various structures. For example, it can be determined how an increase or decrease in focus will affect isolated and dense critical dimensions as well as top and bottom critical dimensions. Likewise, the model can indicate how characteristics will be affected by an increase or decrease in exposure. Through analysis of the measured characteristics with the model, the production process can regularly be tuned to compensate for the drift that may occur in the focus and exposure settings of the photolithography tool. Moreover, because the model incorporates both optical measurements as well as CD-SEM measurements, it is more accurate.

Using both scatterometer and CD-SEM data to form the model, a cross verification process can be done. Specifically, the estimated error of the focus and exposure settings can more accurately be determined by using the fitting error between the two sets of data. This allows a production engineer or designer to know how accurate the model is and make changes, if any, accordingly.

Figure 6:
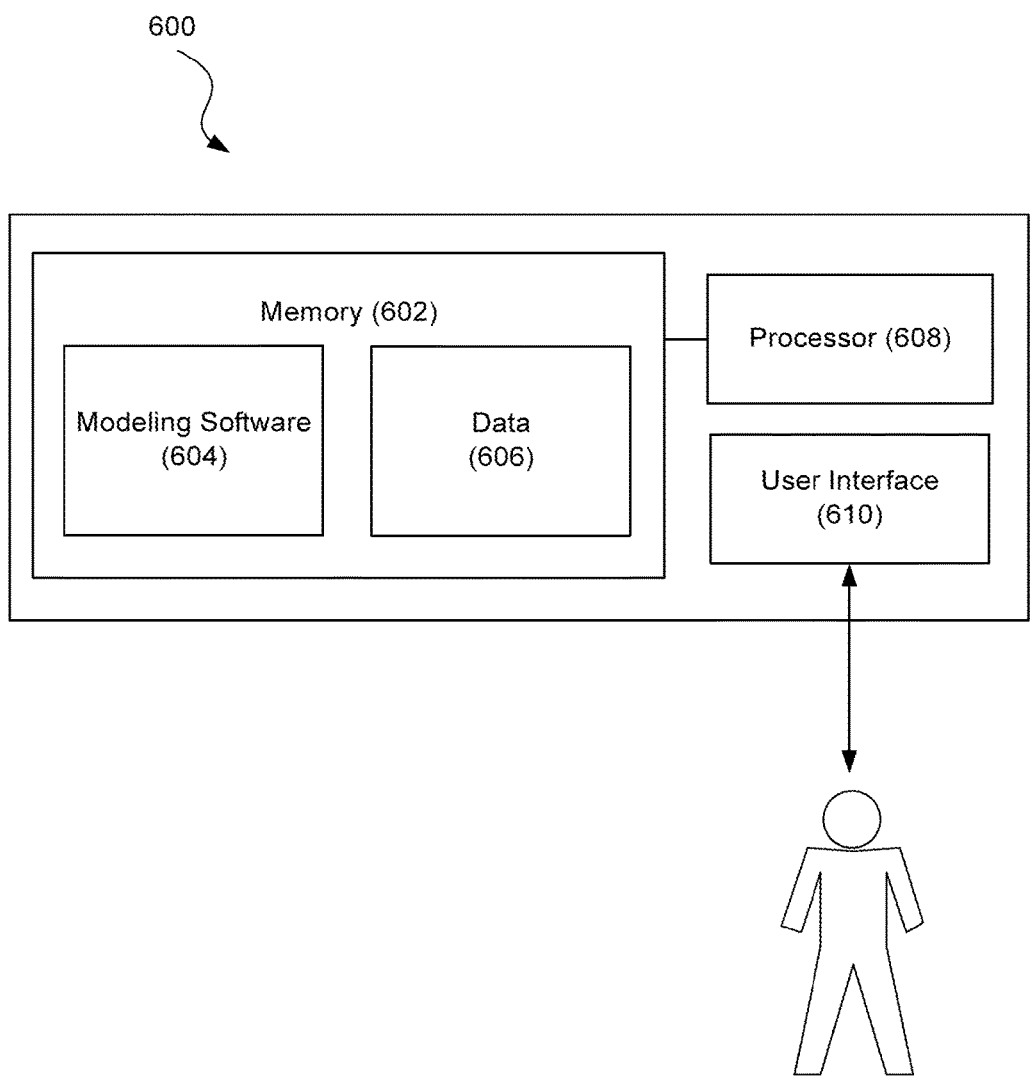
FIG. 6 is a diagram showing an illustrative computer system that may be used to form and use a hybrid focus-exposure matrix model, according to one example of principles described herein.

FIG. 6 is a diagram showing an illustrative computer system that may be used to form and use a hybrid focus-exposure matrix model. According to certain illustrative examples, the physical computing system 600 includes a memory 602 having modeling software 604 and data 606 stored thereon. The physical computing system 600 also includes a processor 608 and a user interface 610.

There are many types of memory available. Some types of memory, such as solid state drives, are designed for storage. These types of memory typically have large storage volume but relatively slow performance. Other types of memory, such as those used for Random Access Memory (RAM), are optimized for speed and are often referred to as "working memory." The various forms of memory may store information in the form of software 604 and data 606.

The physical computing system 600 also includes a processor 608 for executing the software 604 and using or updating the data 606 stored in memory 602. In addition to storing the modeling software 604, the memory 602 may store an operating system. An operating system allows other applications to interact properly with the hardware of the physical computing system.

The modeling software 604 may include the tools to form the FEM model based on the measurements obtained from the substrate. Specifically, the modeling software 604 takes the measurements from the scatterometer of the structures formed under varying focus and exposure conditions. Additionally, the modeling software 604 takes the measurements from the scanning electron microscope of the structures formed under varying focus and exposure conditions. Both sets of measurements can then be structured in a number of ways in order to form the model. Specifically, various functions may be used to extrapolate additional data points from the existing discrete data points obtained through measurement.

A user interface 610 may provide a means for a user 612 to interact with the system. The user may use various tools such as a keyboard or a mouse to input information into the physical computing system. Additionally, various output devices such as a monitor may be used to provide information to the user 612.

Figure 7:
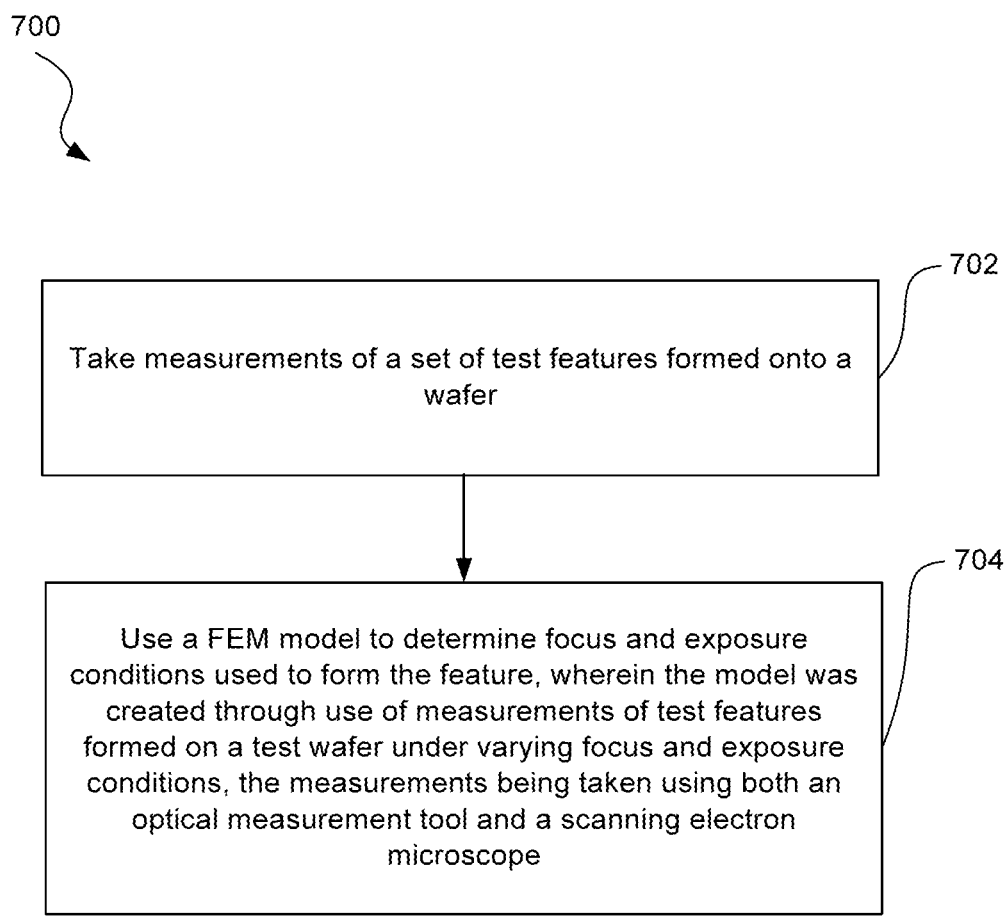
FIG. 7 is a flowchart showing an illustrative method for using a hybrid focus-exposure matrix model, according to one example of principles described herein.

FIG. 7 is a flowchart showing an illustrative method for forming and using a hybrid focus-exposure matrix model. The method includes a step of taking 702 measurements of a set of structures formed onto a substrate. The method further includes a step of using 704 a FEM model to determine focus and exposure conditions used to form the structure. The model was created through use of measurements of structures formed on a substrate under varying focus and exposure conditions, the measurements being taken using both an optical measurement tool and a scanning electron microscope.

According to certain illustrative examples, a method for controlling semiconductor production through use of a hybrid Focus Exposure Matrix (FEM) model includes taking measurements of a set of structures formed onto a substrate and using a FEM model to determine focus and exposure conditions used to form the structure. The model was created through use of measurements of structures formed on a substrate under varying focus and exposure conditions, the measurements being taken using both an optical measurement tool and a scanning electron microscope.

According to certain illustrative examples, a computer system includes a processor and a memory comprising a set of computer readable instructions that when executed by the processor, cause the system to receive a first dataset of measurements taken of a set of structures formed on a first substrate under varying focus and exposure conditions, the measurements obtained through both a scatterometer and a scanning electron microscope, form a model of a relationship between focus, exposure, and the measurements, the model including both scatterometer and scanning electron microscope measurements, receive a second dataset of measurements of a structure formed onto a second substrate, and determine focus and exposure settings used to form the structure formed on the second substrate by using the model and the measurements of the second dataset.

According to certain illustrative examples, a method for controlling production through use of a hybrid Focus Exposure Matrix (FEM) model includes, with an optical measurement tool, taking measurements of a first set of structures formed into a photoresist layer on a first substrate, the first set of structures being designed for measurement by the optical measurement tool and being formed under varying focus and exposure conditions. The method further includes, with a scanning electron microscope, taking measurements of a second set of structures formed into the photoresist layer on the first substrate, the second set of structures being designed for measurement by the scanning electron microscope and being formed under varying focus and exposure conditions. The method further includes forming a model of a relationship between focus, exposure, and the measurements taken by both the optical measurement tool and the scanning electron microscope. The method further includes, with both an optical measurement tool and a scanning electron microscope, taking measurements of a third set of structures formed into a photoresist layer of a second substrate and using the model and the measurements of the third set of structures to determine focus and exposure conditions used to form the structure.

It is understood that various different combinations of the above-listed embodiments and steps can be used in various sequences or in parallel, and there is no particular step that is critical or required. Additionally, although the term "electrode" is used herein, it will be recognized that the term includes the concept of an "electrode contact." Furthermore, structures illustrated and discussed above with respect to some embodiments can be combined with structures illustrated and discussed above with respect to other embodiments. Accordingly, all such modifications are intended to be included within the scope of this invention.

The foregoing has outlined structures of several embodiments. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions and alterations herein without departing from the spirit and scope of the present disclosure.

What is claimed is:

1. A method for controlling semiconductor production through use of a hybrid Focus Exposure Matrix (FEM) model, the method comprising:
   forming a first structure and a second structure on a substrate, wherein the first and second structures are different from each other;
   taking measurements of the first structure using an optical measurement tool and the second structure using a scanning electron microscope, respectively, wherein taking measurements of the first structure using the optical measurement tool includes taking a bottom critical dimension and a top critical dimension of the first structure using the optical measurement tool, wherein the optical measurement tool is a scatterometer;
   using a FEM model to determine a first contour line associated with the first structure according to measurements of the first structure by the optical measurement tool and a second contour line associated with the second structure according to measurements of the second structure by the scanning electron microscope; and
   determining a specific point near an intersection between the first and the second contour lines as focus and exposure conditions used to form the first and second structures,
   wherein the FEM model was created through use of measurements of the first and second structures formed under a plurality of different focus and exposure conditions using the optical measurement tool and the scanning electron microscope, respectively.

2. The method of claim 1, wherein the FEM model was created through use of measurements of structures under a plurality of different focus and exposure conditions.

3. The method of claim 1, further comprising, using the FEM model to determine an optimal focus and exposure setting to achieve desired characteristics for structures to be formed on additional substrates.

4. The method of claim 3, further comprising, adjusting the focus and exposure settings of photolithography equipment to the optimal settings for formation of subsequent substrates.

5. The method of claim 1, wherein the measurements include measurements of line width and pitch.

6. The method of claim 1, wherein the measurements include measurements of a first top critical dimension (TCB) and a first bottom critical dimension (BCD) of the first structure and measurements of a second TCB and a second BCD of the second structure.

7. The method of claim 6, wherein
the determining of the first contour line associated with the first structure includes determining the first contour line associated with the first TCB and a third contour line associated with the first BCD of the first structure;
the determining of the second contour line associated with the second structure includes determining the second contour line associated with the second TCB and a fourth contour line associated with the second BCD of the second structure; and
the determining of the specific point near an intersection between the first and the second contour lines includes determining the specific point near at an intersection among the first, second, third and fourth contour lines as the focus and exposure conditions used to form the first and second structures.

8. The method of claim 1, wherein
the first structure includes a dense structure and the second structure includes an isolated structure;
the measurements of the first structure measured by the optical measurement tool include taking measurements of the dense structure by the optical measurement tool; and
the measurements of the second structure measured by the scanning electron microscope include taking measurements of the isolated structures by the scanning electron microscope.

9. A computer system comprising:
a processor; and
a memory comprising a set of computer readable instructions that when executed by the processor, cause the system to:
receive a first dataset of measurements taken of a first set of structures formed on a first substrate under varying focus and exposure conditions, the first dataset of measurements obtained through a scatterometer, wherein the first dataset of measurements measured by the scatterometer include a bottom critical dimension and a top critical dimension of a dense structure;
receive a second dataset of measurements taken of a second set of structures formed on the first substrate under varying focus and exposure conditions, the second dataset of measurements obtained through a scanning electron microscope;
form a model of a relationship between focus, exposure, and the measurements, the model including the first dataset of measurements obtained through the scatterometer and the second dataset of measurements obtained through the scanning electron microscope, wherein the first set of structures and the second set of structures are different from each other;
receive a third dataset of measurements of a structure formed onto a second substrate; and
determine focus and exposure settings used to form the first and second structures formed on the first substrate by using the model and the third dataset of measurements.

10. The system of claim 9, wherein the measurements taken of the structure formed onto the second substrate were taken using both a scatterometer and a scanning electron microscope.

11. The system of claim 9, wherein the set of computer readable instructions further cause the system to use the model to determine an optimal focus and exposure setting to achieve desired characteristics for structures to be formed on additional substrates.

12. The system of claim 9, wherein the measurements include measurements of line width and pitch.

13. The system of claim 9, wherein the measurements include measurements of side wall angles.

14. The system of claim 9, wherein the second dataset of measurements measured by the scanning electron microscope include a bottom critical dimension and a top critical dimension of an isolated structure.

15. A method for controlling semiconductor production through use of a hybrid Focus Exposure Matrix (FEM) model, the method comprising:
with an optical measurement tool, taking measurements of a first set of structures formed into a photoresist layer on a first substrate, the first set of structures being designed for measurement by the optical measurement tool and being formed under varying focus and exposure conditions, wherein the measurements measured by the optical measurement tool include measuring a bottom critical dimension (BCD) and a top critical dimension (TCD) of the first set of structures, wherein the optical measurement tool is a scatterometer;
with a scanning electron microscope, taking measurements of a second set of structures formed into the photoresist layer on the first substrate, the second set of structures being designed for measurement by the scanning electron microscope and being formed under varying focus and exposure conditions;
forming a model of a relationship between focus, exposure, and the measurements taken by both the optical measurement tool and the scanning electron microscope;
with both an optical measurement tool and a scanning electron microscope, taking measurements of a third set of structures formed into a photoresist layer of a second substrate; and
using the model and the measurements of the third set of structures to determine focus and exposure conditions used to form the structure.

16. The method of claim 15, further comprising, using the model to determine an optimal focus and exposure setting to achieve desired characteristics for additional structures to be formed on additional substrates.

17. The method of claim 16, further comprising, adjusting the focus and exposure settings of photolithography equipment to the optimal settings.

18. The method of claim 15, wherein the first set of structures includes dense structures and the second set of structures includes isolated structures.

19. The method of claim 18, wherein the measurements measured by the scanning electron microscope include measuring a bottom critical dimension and a top critical dimension of the second set of structures.

\* \* \* \* \*